United States Patent [19]

Abel

[11] Patent Number: 4,513,354
[45] Date of Patent: Apr. 23, 1985

[54] HOUSING FOR AN ELECTRONIC CIRCUIT BOARD

[75] Inventor: William E. Abel, Portland, Oreg.

[73] Assignee: Sentrol, Inc., Portland, Oreg.

[21] Appl. No.: 535,864

[22] Filed: Sep. 26, 1983

[51] Int. Cl.³ .............................................. H05K 1/18
[52] U.S. Cl. .................................. 361/399; 361/395; 361/422; 455/128; 340/547
[58] Field of Search .................... 307/116, 150; 320/2; 455/127, 128; 340/546, 547; 361/331, 346, 334, 358, 380, 392, 395, 399, 422, 426, 415; 211/41

[56] References Cited

U.S. PATENT DOCUMENTS

| | | | |
|---|---|---|---|
| 3,087,117 | 4/1963 | Mitchell | 455/128 |
| 3,631,299 | 12/1971 | Meyer | 361/399 |
| 3,701,016 | 10/1972 | Bennett | 455/128 |
| 4,047,242 | 9/1977 | Jakob | 361/399 |
| 4,226,491 | 10/1980 | Kazama | 361/399 |
| 4,335,375 | 6/1982 | Schaeffer | 455/128 |

*Primary Examiner*—G. P. Tolin
*Attorney, Agent, or Firm*—Chernoff, Vilhauer, McClung, Birdwell & Stenzel

[57] ABSTRACT

A housing for an elongate electronic circuit board, including longitudinally extending support rails and opposing pins within the housing to support the margins of a portion of the electronic circuit board which is not deformation-sensitive. A recess is provided on the exterior of the housing to hold electrical power cells therein, thus separating them from the circuit board. An opening to the interior portion of the housing provides access to a portion of the circuit board.

22 Claims, 12 Drawing Figures

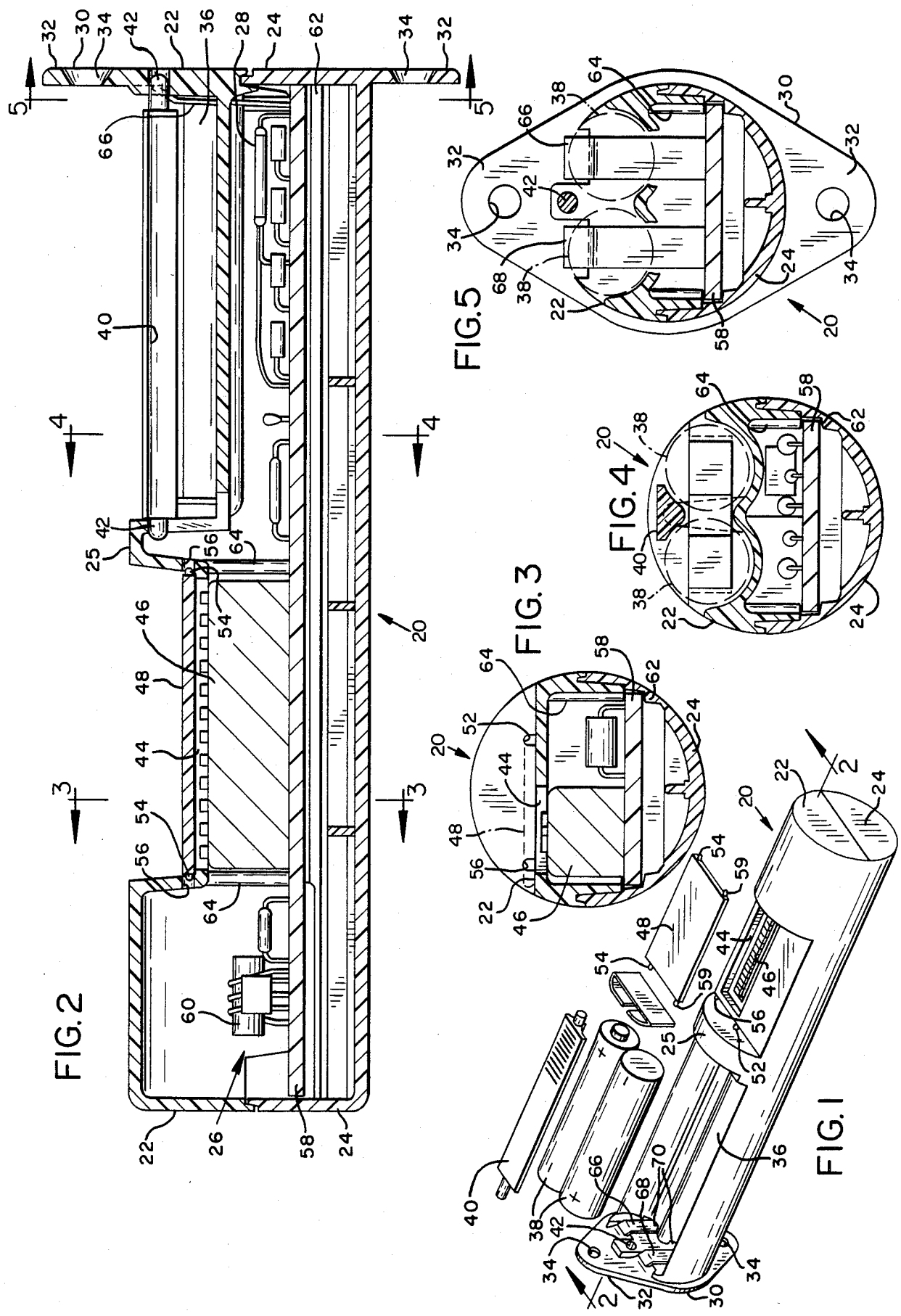

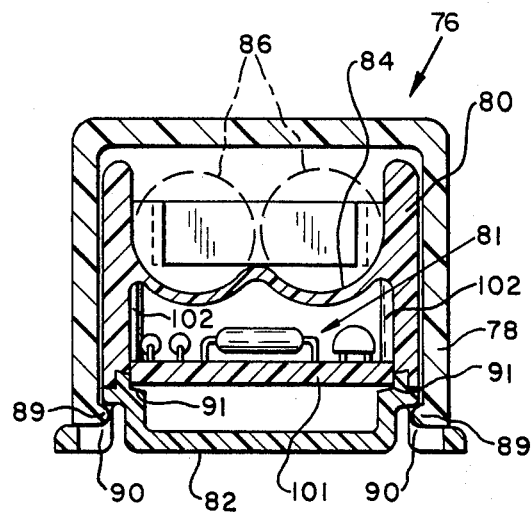
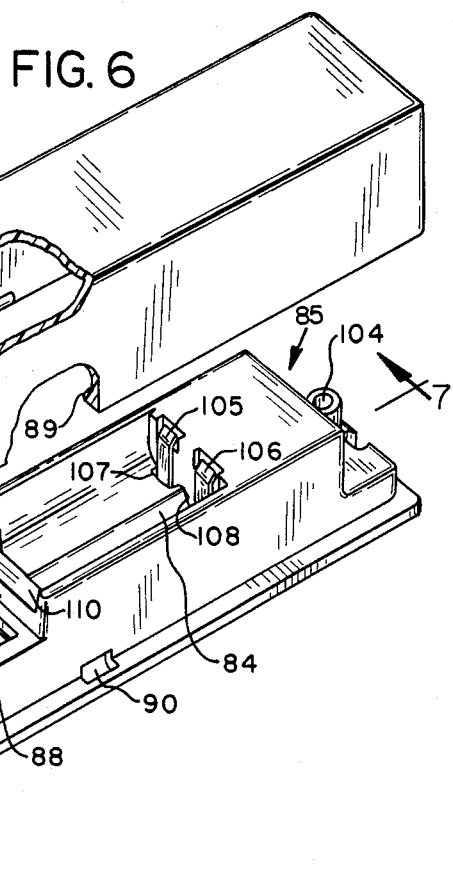
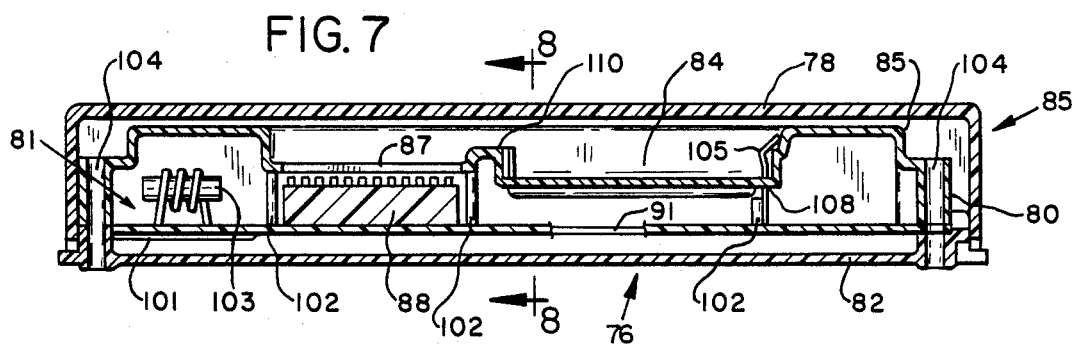

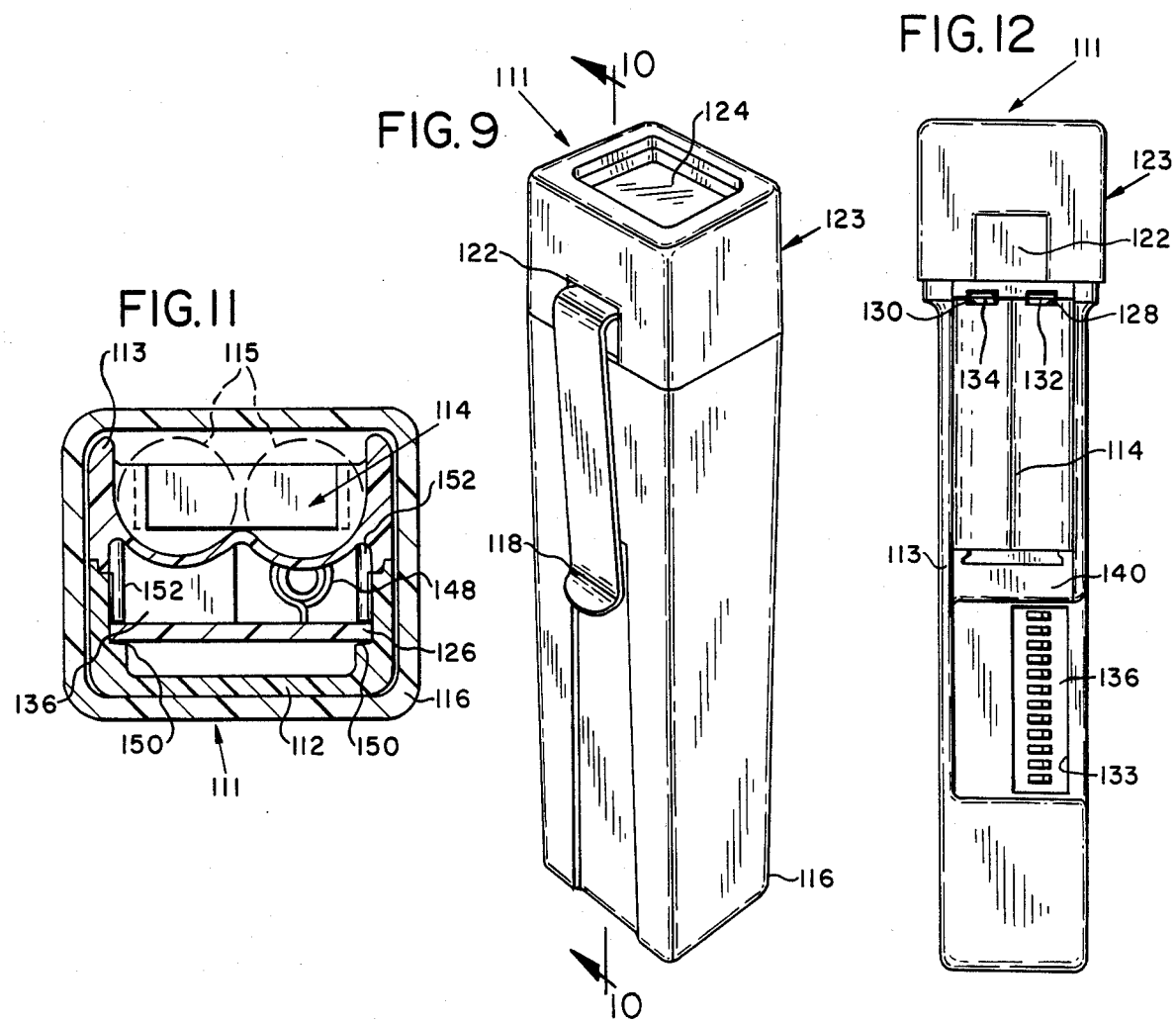

HOUSING FOR AN ELECTRONIC CIRCUIT BOARD

BACKGROUND OF THE INVENTION

The present invention relates to housings for electronic circuitry, and more particularly to housings for miniature radio transmitters.

Alarm systems in which sensors are connected to a central alarm control by wires are vulnerable to being disabled by having wires cut. Additionally, installation of connecting wires is expensive and difficult and may result in unattractive wires being visible. Co-pending U.S. patent application Ser. No. 429,116 filed Sept. 30, 1982, teaches the use of miniature radio transmitters to activate alarm systems. Miniature radio transmitters can provide a system which is less costly to install and which can be almost completely hidden from view.

The miniature radio transmitters described in co-pending U.S. patent application Ser. No. 429,116, which employ alkaline dry cells as a preferred power source, are designed to be essentially free of maintenance for a number of years. The electrical power cells, however, can release gases capable of corroding the transmitter circuit components of the miniature radio transmitter when left for such a long period.

What is needed is a housing which separates the electrical power cells from the transmitter circuit components so that corrosive gases will not come into corroding contact with the circuitry, even when the transmitter is left undisturbed for a number of years. Additionally, the housing should surround the transmitter so that the circuitry will not be affected by exterior contaminants such as dust, dirt or moisture.

Miniature radio transmitters of the type described in my co-pending U.S. patent application Ser. No. 429,116 include a radio-frequency transmission circuit mounted on a circuit board. The radio-frequency transmission circuit is extremely sensitive to mechanical deformation. If this radio-frequency portion of the circuitry is mechanically deformed to any significant extent, a frequency shift of the radio transmitter may result. This shift can become significant enough so that the miniature transmitter will not operate as required.

The co-pending U.S. patent application Ser. No. 429,116 describes a radio transmitter circuit which contains a switch panel which allows the transmitted signal to be coded in order that a receiver system can identify which particular radio transmitter in an alarm system is being activated.

Thus, what is needed is a housing for a miniature transmitter for a wireless alarm system which isolates a deformation-sensitive portion of the circuit from any physical contact with the housing so that minor mechanical deformations of the housing will not affect the deformation-sensitive portion of the circuit, and such a housing should allow the switch panel to be accessible in order that the transmitter signal can be properly coded.

SUMMARY OF THE INVENTION

The present invention provides an improved protective housing for electronic circuit boards which include circuit components that are sensitive to mechanical distortion. The housing of the present invention is designed to support an elongate circuit board within a cavity between a pair of housing shell halves. A pair of oppositely located, longitudinally extending support rails in one shell half support the margins of one side of a circuit board over a majority of the length of the housing, and support pins located in the other shell half support the margins of the opposite side of the circuit board. The longitudinal support rails and the support pins are not found in a portion of the housing, leaving a deformation-sensitive portion of a circuit board which contains a radio-frequency portion of the circuit, self-supporting and free from contact with any support members or with the housing itself. This self-supporting portion of the circuit board will not be appreciably deformed by normal mechanical deformation of the housing which may occur as a result of mounting or handling the housing. Thus, the sensitive portion of the circuit will not readily be deformed or distorted in a manner which would cause the electronic circuits not to function as required.

The housing of the invention includes a recess on its exterior for holding electrical power cells, such as 1½-volt alkaline cells, so that the power cells are separated from an electronic circuit board within the housing. Any potentially corrosive gases generated by the cells are thus isolated from the circuit board so that they will not corrode the transmitter circuitry. The housing also prevents contamination of the transmitter circuit and circuit elements from dust, dirt or moisture.

An opening is included in one shell half to provide access to a switch panel located on the circuit board. In one embodiment of the invention, a pivotably mounted lid is provided to optionally cover the opening or provide access to the interior of the housing.

The housing may preferably be formed of injection-molded plastic and in embodiments suitable either for fixed mounting or for transport on the person of the user.

One portable embodiment of the housing of the invention has a recessed push-button switch mounted at one end of the housing. The push button is located at the end of the housing opposite the end at which the deformation-sensitive portion of the circuit is located; this design prevents appreciable mechanical deformation of the radio frequency portion of the circuit when the push button is manipulated.

It is therefore a primary object of the present invention to provide a protective housing for electronic circuits such as those of a miniature radio transmitter to be used in an alarm system.

A further object is to provide for a housing for an electronic circuit in which electrical power cells are separated from the bulk of circuitry so that there will not be unnecessary contact between the circuitry and any potentially corrosive gases emitted by the power cells.

Another important objective of the present invention is to provide a housing for an electronic circuit, for example, a miniature radio transmitter, in which normal mechanical deformations of the housing will not cause significant distortions in a deformation-sensitive portion of the circuit.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a perspective view of a generally cylindrical transmitter housing embodying the present invention, and a miniature transmitter to be used in a security alarm system located within the housing.

FIG. 2 is a sectional view of the transmitter and housing shown in FIG. 1, taken along the line 2—2, at an enlarged scale.

FIG. 3 is a sectional view of the transmitter and housing shown in FIG. 2, taken along the line 3—3.

FIG. 4 is a sectional view of the transmitter and housing shown in FIG. 2, taken along the line 4—4.

FIG. 5 is a sectional view of the transmitter and housing shown in FIG. 2, taken along the line 5—5.

FIG. 6 is a perspective view of a transmitter and housing suitable for mounting on a flat surface, which is an alternative embodiment of the present invention.

FIG. 7 is a sectional view of the transmitter and housing shown in FIG. 6, taken along the line 7—7.

FIG. 8 is a sectional view of the transmitter and housing shown in FIG. 7, taken along the line 8—8, at an enlarged scale.

FIG. 9 is a perspective view of a portable embodiment of the transmitter and housing.

FIG. 10 is a sectional view of the transmitter and housing shown in FIG. 9, taken along the line 10—10, at an enlarged scale.

FIG. 11 is a sectional view of the transmitter and housing shown in FIG. 9, taken along the line 11—11, at an enlarged scale.

FIG. 12 is a front elevational view of the transmitter and housing shown in FIG. 9, without the detachable cover, showing the side of the housing and transmitter on which a pocket attachment clip is located.

DETAILED DESCRIPTION OF THE INVENTION

Referring first to FIGS. 1-5, a generally cylindrical transmitter housing 20, which may be composed of injection-molded plastic and is suitable for mounting in an upright position in a cylindrical hole above a door or window, is shown. The housing 20 includes a front shell half 22 and a rear shell half 24. The housing 20 is particularly useful for protectively mounting transmitters included in burglar alarm systems because when it is so mounted in a hole it is unobtrusive and protected.

A transmitter 26, located within the housing 20, contains a magnetically-actuated switch 28 located near a first end 30 of the housing 20. The switch 28 is actuated, for example, when a door or window with a magnet attached thereto moves away from the housing 20. Operation of the switch 28 activates the transmitter 26, which then sends a coded signal to a receiver portion (not shown) of the alarm system.

A flange 32 including screw holes 34 extends around the first end 30 to permit the housing 20 to be fastened in place extending vertically upward into a hole in the top of a doorway. The front shell half 22 of the housing 20 defines a recess 36 on the outside of the housing 20 for holding a pair of electrical power cells, such as 1½-volt alkaline cells 38. A retainer 40 has ends which fits into holes 42 in the front shell half 22 to retain the power cells 38.

An opening 44 in the front shell half 22 exposes a portion of the transmitter 26 including a switch panel 46 mounted thereon. A lid 48 is pivotably attached to the front shell half 22 by pintles 59 which fit into holes 52, permitting the lid 48 to be pivoted to an open position or be swung shut to cover the opening 44.

FIG. 2 shows the housing 20 with the lid 48 in the closed position protecting the switch panel 46 from potentially corrosive battery gases. The switch panel 46 can be reached easily, if one wishes to change the coded signal the transmitter sends, by simply opening the lid 48. Bumps 54 may be provided on the lid 48 to resiliently snap into sockets 56 to retain the lid 48 in a closed position.

As may be seen in FIGS. 2-5, the transmitter 26 circuit is mounted on a circuit board 58. A portion of the circuit, including a coil 60, is sensitive to physical strain, since mechanical distortion can result in variance of the transmitter signal's frequency. FIG. 2 shows a coil 60 mounted on a portion of the transmitter circuit board 58 which is not in contact with any support members or any portion of the housing. Thus, minor mechanical deformations of the housing 20, as could be expected to result from mounting the housing 20, will not cause this deformation-sensitive portion of the circuit board 58 to contact the interior of the housing 20. Therefore, the coil 60 and associated circuitry will not be distorted nor cause the transmitter not to function.

A pair of narrow longitudinal support rails 62, located in the rear shell half 24, extend along the longitudinal margins of the circuit board 58 from the first end 30 of the housing 20, and thus support the majority of the length of the circuit board 58 from the rear side. Support pin members 64 are located in the front shell half 22 and serve to support the opposite, or front, side of the circuit board 58. Support pin members 64 are located so as to contact the circuit board 58 only at predetermined points opposite the support rails 62 where the pin members 64 will not contact circuit elements. This insures that the circuit elements, such as printed conductors and mounted circuit components including the coil 60, will not be distorted by contact with the support rails 62 or pin members 64. The shape of the support pin members 64 as shown is convenient for molding, but other shapes could be used so long as they provide support for the circuit board 58 without interference with circuit components.

The power cells 38 are separated from the transmitter circuit board 58 by a layer of the material of the front shell half 22 which defines the recess 36, except that conductors 66 and 68 extend from the circuit board 58 to the cells 38 through apertures 70. The switch panel 46 is also separated from the power cells 38 by an abutment 25 so that the switch panel 46 will not be unnecessarily exposed to potentially corrosive gases even if the lid 48 is open.

Since the flange 32 is located at the first end 30 of the housing, opposite the end at which the deformation-sensitive portion of the circuit board 58 of the transmitter 26 is located, using the flange 32 permits fixed mounting of the housing 20 without deformation of the sensitive portion of the circuit board 58. The flange 32 thus helps avoid distortion of the portion of the circuit including the coil 60 and lessens the likelihood of the transmitter 26 not functioning as required.

A generally rectangular housing 76, which is another embodiment of the present invention and which may also be made of injection-molded plastic, is shown in FIGS. 6, 7, and 8. The housing 76 is suitable for fixed mounting on a flat surface. A transmitter 81, which is similar to transmitter 26 in housing 20, is located within housing 76, and includes a portion of its circuit which is sensitive to physical deformation.

The housing 76 includes a cover 78, a front shell half 80, and a rear shell half 82. The front shell half 80 of the housing 76 defines a recess 84 near a first end 85 adapted for holding a pair of electrical power cells 86, which may be 1½-volt alkaline cells like the cells 38 shown in FIG. 2. An opening 87 is provided in the front shell half 80 to provide access to a switch panel 88 which is part of the circuit of the transmitter 81. The removable cover 78 fits over the front shell half 80, and completely covers it, with tabs 89 of the cover 78 latching into slots 90 in the rear shell half 82. The cover 78 serves to hold the power cells 86 in place in the recess 84 and additionally serves to cover and protect the switch panel 88 which is exposed through an opening 87.

The rear shell half 82 is generally rectangular and includes a pair of narrow longitudinal support rails 91 extending frontwardly. The rearmost side of rear shell half 82 has an outer margin defining an essentially flat surface which allows housing 76 to be mounted on a flat surface.

The support rails 91 extend along the longer sides of the rear shell half 82 from the first end 85 of the housing 76 and provide suport for the margins of a circuit board 101, which includes the circuit of the transmitter 81. The rails 91 thus support the majority of the length of the circuit board 101 from the rear side. Support pin members 102 are located in the front shell half 80 and serve to support the opposite, or front, side of the circuit board 101, contacting the circuit board 101 only at predetermined points which do not contain circuit elements. This insures that the circuit elements, such as printed conductors and mounted circuit components, will not be distorted by contact with the support rails 91 or pin members 102.

Referring to FIG. 7, a deformation-sensitive portion of the transmitter 81, including a coil 103, is mounted on a portion of a circuit board 101 which is not in contact with any support rails or members or any portion of the housing 76. Leaving the deformation-sensitive portion of the circuit board 101 self-supporting assures that minor mechanical deformations of the housing 76, as could be expected to result from mounting the housing 76, will not cause this deformation-sensitive portion of the circuit board 101 to contact the interior of the housing 76. Therefore, the coil 103 will not be distorted nor cause the transmitter not to function.

Mounting screw guides 104 extend rearwardly through the major portion of the front and rear shell halves 80 and 82 to allow the housing 76 to be mounted on any flat surface such as a wall or ceiling. The mounting screw guides 104 have adequate strength so that even if the housing is mounted on a warped surface, mounting screws (not shown) used in the guides 104 to mount the housing 76 will not distort the housing 76 to such an extent as to distort the circuit board 101 enough to affect the transmitter 81 or other deformation-sensitive circuits.

The power cells 86 are separated from the transmitter circuit board 101 by the material of the front shell half 80 which defines the recess 84, except that conductors 105 and 106 extend from the circuit board 101 to the power cells 38 through respective apertures 107 and 108 and, except for the opening 87 in front shell half 80. The switch panel 88, like the switch panel 44 of the transmitter 26, is physically separated from the power cells 86 by an abutment 110.

A housing 111, shown in FIGS. 9–12, is a third embodiment of the invention. It is also intended to house a miniature radio transmitter which is part of a security alarm system, and can be carried easily by a security guard, to be activated in the event of an emergency or by a person with a medical condition which might require assistance. It includes a rear shell half 112 matingly joined with front shell half 113. Referring to FIG. 12, the front shell half 113 of the housing 111 defines a recess 114 for holding a pair of electrical power cells, such as 1½-volt alkaline cells 115.

An attachment clip 118, shown in FIGS. 9 and 10, serves the dual purpose of holding a removable cover 116 in place and also allows attachment of the housing 111 to the user's clothing. The clip 118 is made of a single piece of metal, bent over upon itself into a "U" shape, with one side of the U running along the inner surface of the cover 116 and fixedly attached to the inner surface of the cover 116, as by gluing the one side of the U-shaped clip into slot 120. The other side of the U-shaped clip 118 extends along the outer surface of cover 116. The portion of the clip 118 at which the clip folds back on itself is designed to snugly fit into a small recess 122 in the front shell half 113 and to thereby assist in holding the cover 116 in place attached to the housing 111.

FIGS. 9 and 10 depict the housing 111 with detachable cover 116 in place. The cover 116 surrounds the major portion of shell halves 112 and 113 and serves to protect the interior of the housing from contamination and to hold power cells 115, shown in FIG. 11, in place. The cover 116 also helps to protect the transmitter 121 circuit from damage if it should be dropped, hit or mishandled. A first end portion 123 of housing 111 is not surrounded by cover 116 as end portion 123 contains a push button 124 which must remain accessible.

The power cells 115, shown in FIG. 11, are separated from a circuit board 126, similar to circuit board 58 of housing 20, by the material of the front shell half 113 which defines the recess 114, except that conductors 128 and 130 extend from the circuit board 126 through apertures 132 and 134, respectively, and an opening 133 is provided in front shell half 113 to permit access to a switch panel 136, or other portion of an electronic circuit contained within the housing 111.

As may be seen in FIG. 10, a transmitter 121 may be similar to transmitter 26 described previously. A switch panel 136, which is a portion of transmitter 121, is mounted on circuit board 138 and, like the switch panel 44 of transmitter 26, is physically separated from the power cells 115 by an abutment 140, and can be reached through the opening 133 in the front shell half 113, if one wishes to change the coded signal transmitter 121 sends.

A recessed push button 124 located at first end 123 of housing 111 can be pushed inwardly to activate the transmitter 121. The push button 124 is recessed to prevent accidental activation of the transmitter 121.

When the push button 124 is depressed, a ridge 142 forces a leaf-spring contact 144, held by a ledge 145, against bar contact 146 and closes a circuit which causes transmitter 121 to transmit a coded signal to a receiver (not shown). The push button 124 is located in end portion 123 of the housing 111. The end portion 122 is opposite the end of the housing 111 at which a deformation-sensitive end of the circuit board 126 containing a coil 148 thereon, which is like coil 60 of transmitter 26, is located. Activation of the switch 124 will therefore not cause appreciable mechanical deformation in the portion of the transmitter circuitry which is deformation-sensitive. This lessens the likelihood that the coil 148 will be distorted so greatly that the transmitter 121, or other sensitive circuit elements contained within housing 111, will not function as required.

Housing 111 has a pair of narrow longitudinal support rails 150, located in the rear shell half 112, extending longitudinally from the end 123 of the housing 111, and a plurality of support pin members 152, located in the front shell half 113. Support rails 150 and pin members 152 perform the same function as, and support the circuit board 126 in the same manner as, support rails 62 and support pin members 64 support circuit board 58. Thus, mechanical distortions of the coil 148 and the deformation-sensitive portion of the circuit are minimized.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A housing for an elongate electronic circuit board having a deformation-sensitive portion located at one end thereof, comprising:
   (a) a first elongate shell member;
   (b) a second elongate shell member matingly joined with said first elongate shell member, said first and second elongate shell members defining a cavity therebetween and defining first and second ends of said housing;
   (c) support rail means located in said first elongate shell member and extending longitudinally therein from a location adjacent said first end toward said second end, for supporting a first side of an elongate circuit board within said cavity by contact against respective longitudinal marginal portions thereof;
   (d) support pin means, located in said second elongate shell member opposite said support rail means, for supporting a second side of said elongate circuit board by contact against respective longitudinal marginal portions of said second side of said elongate circuit board; and
   (e) said support rail means extending longitudinally of said first shell member from said first end a distance more than half but less than the entire length of said first shell member, and said cavity being free from said support rail means and support pin means over a predetermined distance from said second end, and said housing defining protective means for enclosing within said cavity a self-supporting deformation-sensitive portion of said circuit board extending beyond said support rail means toward said second end without contact between either of said first and second shell members and said deformation-sensitive portion when said circuit board is held in said cavity with said support rail means and support pin means supporting said respective longitudinal marginal portions.

2. The housing of claim 1 wherein said support pin means comprises a plurality of support pin members each aligned generally perpendicular to said support rail means and each having an end located so as to contact a predetermined point on said circuit board.

3. The housing of claim 1, including means defining an opening through one of said first and second shell members for providing access to a portion of said circuit board including a switch panel mounted thereon.

4. The housing of claim 3, further including a lid pivotably attached to said one of said first and second shell members and moveable between a closed position covering said opening and an open position allowing access to the interior of said housing.

5. The housing of claim 1, further including a recessed push button located adjacent said first end of said housing.

6. The housing of claim 1, wherein one of said first and second shell members defines a recess located on its exterior, said recess being adapted for receiving at least one electrical power cell.

7. The housing of claim 6, further including retainer means for retaining at least one electrical power cell in said recess.

8. The housing of claim 6, further including a cover removably attached to said housing and surrounding said recess.

9. The housing of claim 1 wherein said first and second shell members cooperatively define a generally cylindrical shape, further including a flange located at said first end of said housing.

10. The housing of claim 1, including means for attaching said housing to a person's clothing.

11. The housing of claim 1 including a base plate connected with one of said shell members and means for mounting said housing with said base plate fitting against a flat surface.

12. In combination, an elongate electronic circuit board and a housing therefor, comprising:
   (a) a first elongate shell member;
   (b) a second elongate shell member matingly joined with said first elongate shell member, said first and second elongate shell members defining an elongate cavity therebetween;
   (c) an elongate circuit board having first and second sides and respective longitudinal marginal portions of each of said first and second sides, said circuit board having deformation-sensitive circuit components mounted thereon;
   (d) a pair of longitudinally oriented support rails included in said first elongate shell member and located within said cavity, supporting said first side of said circuit board by contact against said longitudinal marginal portions thereof;
   (e) a plurality of support pin means, included in said second elongate shell member and located within said cavity, for supporting said longitudinal marginal portions of said second side of said circuit board in respective locations opposite said support rails;
   (f) said housing having a first end and a second end, said support rail means extending from a location within said cavity adjacent said first end more than half but less than the entire distance toward said second end and said support pin means being present only in a portion of said cavity extending from a location adjacent said first end more than half but less than the entire distance toward said second end, said circuit board being located within said cavity and extending from a location proximate said first end to a location proximate said second end and a portion of said housing proximate said second end being free from said support rails and support pin means and said deformation-sensitive circuit components being located on a portion of said circuit board proximate said second end, said last mentioned portion of said circuit board being self-supporting and free from contact with said rail means and support pin means.

13. The circuit board and housing combination of claim 12 wherein said support pin means comprises a plurality of support pin members each aligned generally perpendicular to said support rail means and each having an end located so as to contact a predetermined point on said circuit board.

14. The circuit board and housing combination of claim 12, said circuit board including a switch panel mounted thereon and said housing including means defining an opening through one of said first and second shell members for providing access to said switch panel.

15. The circuit board and housing combination of claim 14, further including a lid pivotably attached to said one of said first and second shell members and movable between a closed position covering said opening and an open position allowing access to the interior of said housing.

16. The circuit board and housing combination of claim 12, further including a recessed push button located adjacent said first end of said housing.

17. The circuit board and housing combination of claim 12, wherein one of said first and second shell members defines a recess located on its exterior, said recess being adapted for receiving at least one electrical power cell.

18. The circuit board and housing combination of claim 17, further including retainer means associated with said housing for retaining at least one electrical power cell in said recess.

19. The circuit board and housing combination of claim 18, further including a cover removably attached to said housing and surrounding said recess.

20. The circuit board and housing combination of claim 12 wherein said first and second shell members cooperatively define an elongate generally cylindrical shape, further including a radially extending flange located at said first end of said housing.

21. The circuit board and housing combination of claim 12, including means fixedly attached thereto for removably attaching said housing to a person's clothing.

22. The circuit board and housing combination of claim 12 including a base plate connected with one of said shell members and means for mounting said housing with said base plate fitting against a flat surface.

* * * * *